United States Patent
Ku et al.

(10) Patent No.: US 7,353,479 B2
(45) Date of Patent: Apr. 1, 2008

(54) METHOD FOR PLACING PROBING PAD AND COMPUTER READABLE RECORDING MEDIUM FOR STORING PROGRAM THEREOF

(75) Inventors: Chien-Yi Ku, Jhubei (TW); Szu-Sheng Kang, Hsinchu (TW)

(73) Assignee: Faraday Technology Corp., Hsin-Chu (TW)

( * ) Notice: Subject to any disclaimer, the term of this patent is extended or adjusted under 35 U.S.C. 154(b) by 307 days.

(21) Appl. No.: 10/906,009

(22) Filed: Jan. 31, 2005

(65) Prior Publication Data

US 2006/0190891 A1   Aug. 24, 2006

(51) Int. Cl.
G06F 17/50 (2006.01)

(52) U.S. Cl. .............................. 716/10; 716/8; 716/11

(58) Field of Classification Search .................. 716/10, 716/8, 11
See application file for complete search history.

(56) References Cited

U.S. PATENT DOCUMENTS

| | | | | |
|---|---|---|---|---|
| 5,485,081 A * | 1/1996 | Whitehead et al. | ...... | 324/158.1 |
| 5,530,372 A | 6/1996 | Lee et al. | ...... | 324/758 |
| 5,675,499 A | 10/1997 | Lee et al. | ...... | 364/488 |
| 5,936,876 A * | 8/1999 | Sugasawara | ...... | 365/51 |
| 6,066,808 A * | 5/2000 | Kresge et al. | ...... | 174/262 |
| 6,097,884 A | 8/2000 | Sugasawara | ...... | 395/500 |
| 6,225,143 B1 * | 5/2001 | Rao et al. | ...... | 438/106 |
| 6,323,048 B1 * | 11/2001 | Chevallier | ...... | 438/14 |
| 6,429,675 B2 * | 8/2002 | Bell | ...... | 324/765 |
| 6,437,364 B1 * | 8/2002 | Wu | ...... | 257/48 |
| 6,987,397 B2 * | 1/2006 | Bartley et al. | ...... | 324/754 |
| 7,061,263 B1 * | 6/2006 | Ong | ...... | 324/765 |
| 2002/0105337 A1 * | 8/2002 | Coates et al. | ...... | 324/519 |
| 2003/0235929 A1 * | 12/2003 | Cowles et al. | ...... | 438/17 |
| 2005/0001640 A1 * | 1/2005 | Swart | ...... | 324/754 |
| 2005/0272174 A1 * | 12/2005 | Duan et al. | ...... | 438/18 |
| 2006/0022353 A1 * | 2/2006 | Ajuria et al. | ...... | 257/786 |
| 2006/0192579 A1 * | 8/2006 | Jacobsen et al. | ...... | 324/758 |

* cited by examiner

*Primary Examiner*—Jack Chiang
*Assistant Examiner*—Suchin Parihar
(74) *Attorney, Agent, or Firm*—Winston Hsu

(57) ABSTRACT

A method for placing probing pad and a computer readable recording medium for storing a program thereof are provided. The method is suitable for placing the probing pads in an integrated circuit (IC). Wherein, appropriate grid spacing is determined and a plurality of grids with fixed grid spacing is generated. The location of each preformed grid on the net connecting to the interesting pin is defined as first candidate probing points. Then, based on the metal layer where the first candidate probing points are located and the corresponding locations between the first candidate probing points and the interesting pin, one candidate probing point among all of the first candidate probing points on each net where the probing pad can be placed on is selected as the probing point. Finally, a probing pad is placed on each of the selected probing points.

14 Claims, 3 Drawing Sheets

METHOD FOR PLACING PROBING PAD AND COMPUTER READABLE RECORDING MEDIUM FOR STORING PROGRAM THEREOF

BACKGROUND OF THE INVENTION

1. Field of the Invention

The present invention relates to a method for probing an integrated circuit (IC), and more particularly, to a method for placing probing pads in an integrated circuit (IC).

2. Description of the Related Art

During the research and fabrication of integrated circuits, IC debugging and failure analysis are performed on defective ICs. A general method is to probe a suspecious path inside the invalid IC. In order to probe a signal status of the path inside the IC, preparation must be taken before the probing operation.

First, before probing, a net corresponding to a layout is selected from a netlist. Then, an appropriate probing point is determined based on experience. Then, a FIB (focus ion beam) technique is applied in the probing point to drill a hole on a passivation layer and an inter-metal-dielectric layer (IMD). Finally, metal is deposited on the probing point to form a probing pad for probing.

However, this method has many disadvantages; for example, searching the appropriate probing point based on experience is very inefficient. In addition, the original circuitry may be altered due to the hole drilled by FIB technique and the probing pad formed by deposition. Whether the process of drilling the hole by FIB technique and forming probing pad by deposition are correct or not has not been verified yet. For example, a hole drilled close to another net will result in shortcut of two different nets. Therefore, it is hard to determine whether the probing result is a real signal status of the IC or is an incorrect signal status from the wrong process of drilling the hole by FIB technique and forming the probing pad by deposition.

SUMMARY OF THE INVENTION

Therefore, it is an object of the present invention to provide a method for placing a probing pad, such that the probing pads for part or all of the nets can be automatically pre-placed during the physical implementation of the integrated circuit (IC). Accordingly, the correctness of the probing pad added into the IC can be verified.

It is another object of the present invention to provide a computer readable recording media for storing a program executable in a computer system. Wherein, the program is used to automatically place the probing pads into the IC. Therefore, compared with determining the probing point by experience, the present invention is able to place the probing pads into the IC more efficiently.

The present invention provides a method for placing the probing pads for placing at least one probing pad into the IC. Wherein, the probing pad is used to electrically conduct a probing point to a top metal layer, and the IC comprises at least one interesting pin. The method comprises the following steps. First, a cross-reference database between a netlist and a layout is provided. Then, appropriate grid spacing is determined based on the layout characteristic and a plurality of grids with fixed grid spacing are formed. The location of each preformed grid on the net connecting to the interesting pin is defined as a first candidate probing point based on the cross-reference database. Then, based on the metal layer where the first candidate probing points are located and the corresponding locations between the first candidate probing points and the interesting pin, one candidate probing point among all of the first candidate points on each net where the probing pad can be placed is selected as the probing point. Finally, a probing pad is placed on each of the selected probing points.

The method for placing the probing pads according to an embodiment of the present invention further comprises a step of specifying an interesting pin in the IC. In addition, the step of providing a cross-reference database mentioned above further comprises providing a layout and a netlist; and building a cross-reference database based on a correlation of the layout and the netlist.

In the method for placing the probing pads according to an embodiment of the present invention, the step of selecting one of the first candidate probing points as a probing point mentioned above comprises: excluding all of the first candidate probing points in each metal layer where the probing pad cannot be placed on, and the non-excluded first candidate probing points are defined as the second candidate probing points; and based on the metal layer where the second candidate probing points are located and corresponding locations between the second candidate probing points and the interesting pin, sequentially determining which probing point in the second candidate probing points is selected as the probing point for the net connecting to the interesting pin.

In the method for placing the probing pads according to an embodiment of the present invention, the step of defining the second candidate probing points mentioned above comprises: defining an blockage area corresponding to each metal layer based on a spacing rule of each metal layer pre-defined in the design rule; selecting one of the metal layers starting from the first metal layer to the top metal layer sequentially, and defining the first candidate probing points, which are located inside the selected metal layer pattern and outside the blockage area of the metal layer, as the second candidate probing points.

In the method for placing the probing pads according to an embodiment of the present invention, the step of selecting one second candidate probing point among the second candidate probing points as the selected probing point mentioned above comprises: sequentially selecting an interesting pin; selecting and defining one of the second candidate probing points, which is located in a higher metal layer and inside the net connecting to the selected interesting pin, as a third candidate probing point; and selecting one of the third candidate probing points, which is located closest to the interesting pin and inside the net connecting to the selected interesting pin, as the selected probing point.

The present invention provides a computer readable recording medium for storing a program executable in a computer system, and the program is used to place the probing pad into the IC. Wherein, the probing pad is used to electrically conduct a selected probing point to a top metal layer. The program comprises the following instructions. First, a cross-reference database between a netlist and a layout is read out. Then, each preformed grid of the net for the interesting pin is defined as a first candidate probing point based on the cross-reference database. Thereafter, based on the metal layer where the first candidate probing points are located and the corresponding locations between the first candidate probing points and the interesting pin, one candidate probing point among all of the first candidate points on each net where the probing pad can be placed is selected as the probing point. Finally, a probing pad is placed on the probing point selected for each net.

Since the probing pads are pre-placed on part or all of the nets inside the IC during the IC layout process, the present invention is able to perform a verification process, such as design rule check (DRC) and layout vs. schematic (LVS), on the probing pads. Accordingly, the verified pre-set probing pad can be used to probe the suspecious path in case the IC is invalid. Therefore, it is assured that the verified result is the real signal status of the IC.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

DESCRIPTION OF THE EMBODIMENTS

Figure 1:
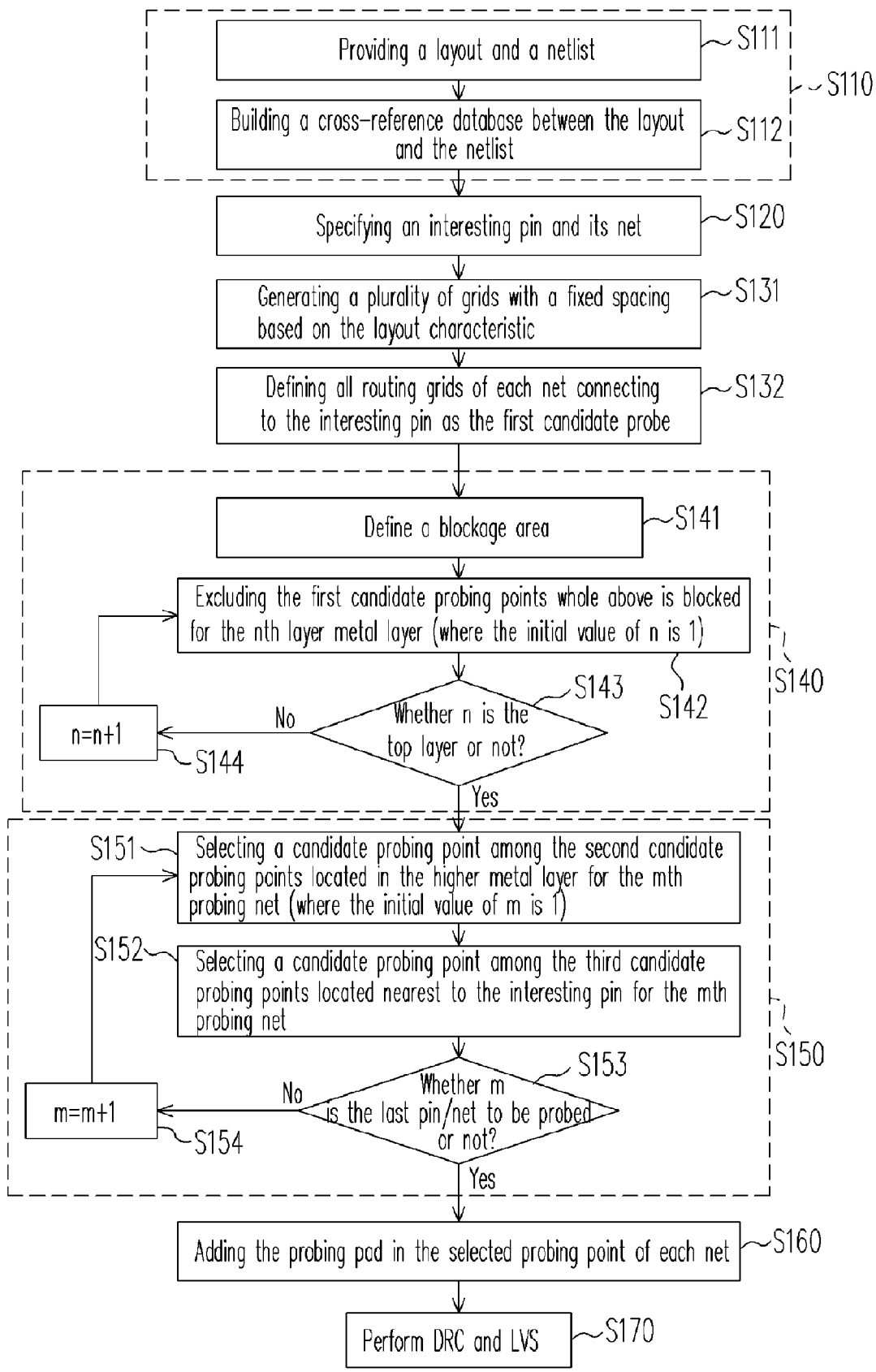
FIG. 1 schematically shows a flow chart illustrating a method for placing the probing pads according to an embodiment of the present invention.

FIG. 1 schematically shows a flow chart illustrating a method for placing the probing pads according to an embodiment of the present invention. Referring to FIG. 1, the probing pad has been pre-placed in the IC in the present embodiment. Wherein, the probing pad is used to electrically conduct a selected probing point to a top metal layer for further probing such as e-beam probing. The method comprises the following steps. First, in step S110, a cross-reference database between a netlist and a layout is provided. Here, step S110 is implemented as two steps: providing the layout and the netlist (step S111); and building the cross-reference database based on a correlation between the layout and the netlist (step S112).

In step S120, an interesting pin is specified in the IC. The interesting pin specified herein may be any pin randomly selected by the designer in a critical net of the IC. In step S131, a grid with fixed spacing is generated based on the layout characteristic. Then, in step S132, all preformed grids of the net connecting to the interesting pin are defined as the first candidate probing points based on the cross-reference database.

In step S140, all of the first candidate probing points where the probing pad cannot be placed on are excluded, and the non-excluded first candidate probing points are defined as the second candidate probing points. Some of the first candidate probing points are excluded because the probing pad is used to electrically conduct the selected probing point to the top metal layer, and if some layout of the metal layer above the probing point blocks the probing, or the placement of the probing pad violates the design rule, the probing pad cannot be placed on the probing point location.

An embodiment of step S140 is described below. First, a blockage area corresponding to each metal layer is defined based on the layout of each metal layer and a minimum spacing rule of the design rule (step S141). Wherein, the blockage area is a geometric area formed by adding a minimum spacing to each of the metal layers (where the real size is dependant on the fabricating requirement). Then, one of the metal layers is selected among the metal layers starting from the first metal layer to the top metal layer sequentially. First, a first metal layer is selected, and the first candidate probing points inside the blockage area in the first metal area are excluded (step S142). The first candidate probing points outside the blockage area indicate that forming the probing pad on such location dose not violate the design rule. Therefore, the first candidate probing points outside the blockage area are defined as the second candidate probing points in step S142. Then, if the currently selected metal layer is not the top metal layer (step S143), a next metal layer is selected (step S144). Then, step S142 is repeated until the currently selected metal layer is the top metal layer. Accordingly, all of the first candidate probing points inside the blockage area in the currently selected metal layer are excluded.

After step S140 is completed, step S150 is performed, where a second candidate probing point among the second candidate probing points of each net connecting to the interesting pin is selected as a final probing point based on the metal layer where the second candidate probing points are located and corresponding locations between the second probing points and the interesting pin. Then, in step S160, a probing pad is placed on the final probing point of each net. Finally, in step S170, design rule check (DRC) and layout vs. schematic (LVS) verification processes are performed on the layout of the IC where the probing pad had been placed on. Accordingly, the verified pre-set probing pad can be used to probe the suspicious path in case the IC is invalid. Therefore, it is assured that the verification result is the real signal status of the IC.

Figure 2A:
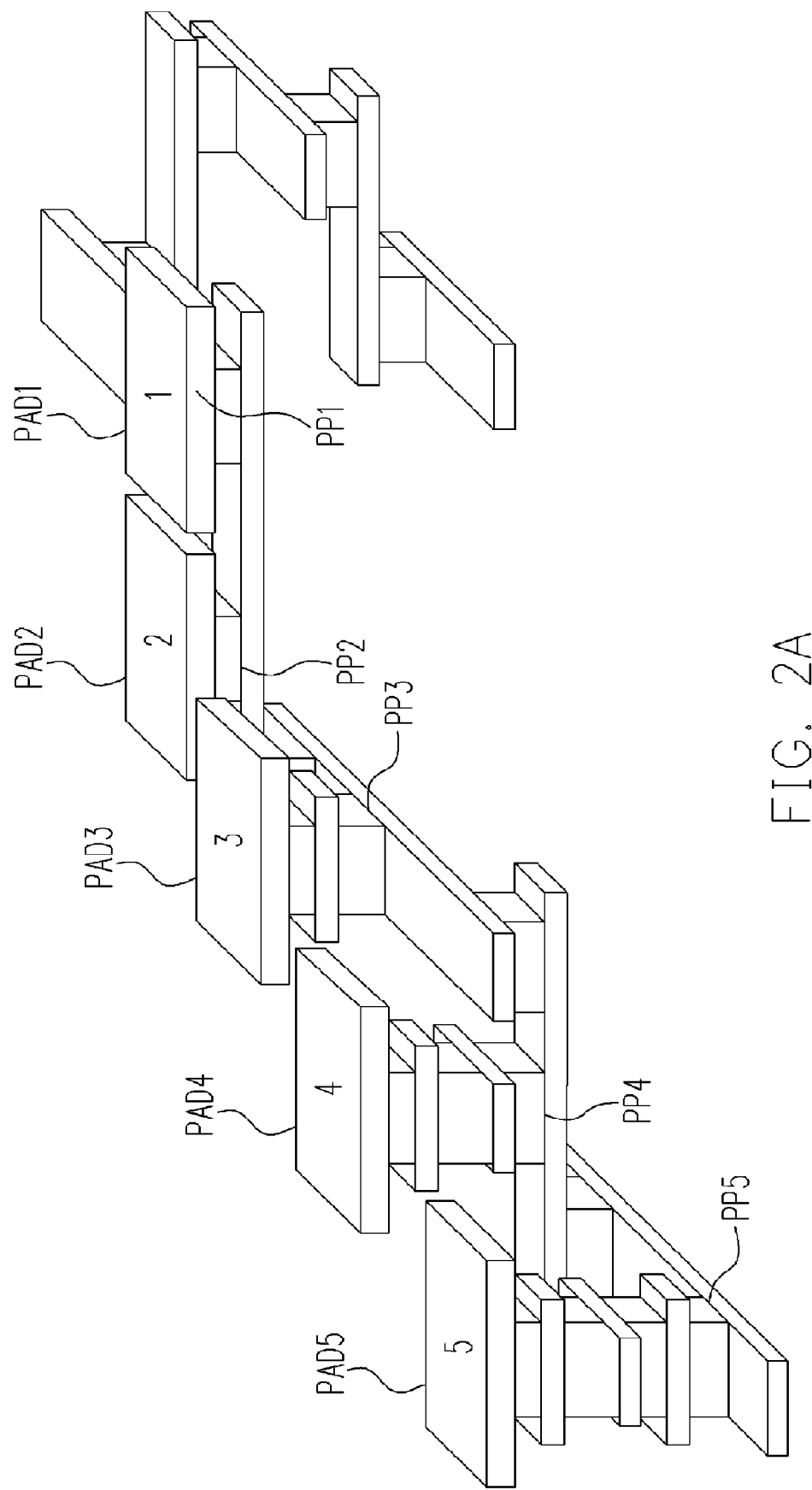
FIG. 2A schematically shows a 3D diagram illustrating a priority of selecting the probing points in the net inside the IC according to an embodiment of the present invention.

The step S150 mentioned above is implemented by the following steps. First, the interesting pins are sequentially selected. Then, the second candidate probing points, which are located in the higher metal layer inside the net connecting to the currently selected interesting pin, are selected and defined as the third candidate probing points (step S151). FIG. 2A schematically shows a 3D diagram illustrating a priority of selecting the probing points in the net inside the IC according to an embodiment of the present invention. As shown in FIG. 2A, there are 5 candidate probing points PP1~PP5 where the probing pad can be placed on (i.e. the second candidate probing points) in the net connecting to a specific interesting pin. For a clear description of the probing pad, it is to be noted that each of the candidate probing points PP1~PP5 has a probing pad (PAD1~PAD5) respectively. However, only one probing pad is required to be placed on a same net for probing purpose. In other words, only one probing pad among the probing pads PAD1~PAD5 shown in FIG. 2A is required to be selected and reserved, others can be spared.

As shown in FIG. 2A, the candidate probing point PP5 is located in the bottom metal layer (such as the first metal layer in this case), the candidate probing point PP4 is located in a metal layer higher than the candidate probing point PP5, the candidate probing point PP3 is higher than the candidate probing point PP4, the candidate probing point PP2 is higher than the candidate probing point PP3, and the candidate probing point PP1 is located in the higher metal layer of this net (not necessarily the top metal layer of the IC). Therefore, the candidate probing point PP1 located in the higher metal layer is selected as the third candidate probing point in step S151. As shown in the diagram, since there is only one candidate probing point PP1 in the higher metal layer, the candidate probing point PP1 is selected as the final probing point in this net.

Figure 2B:
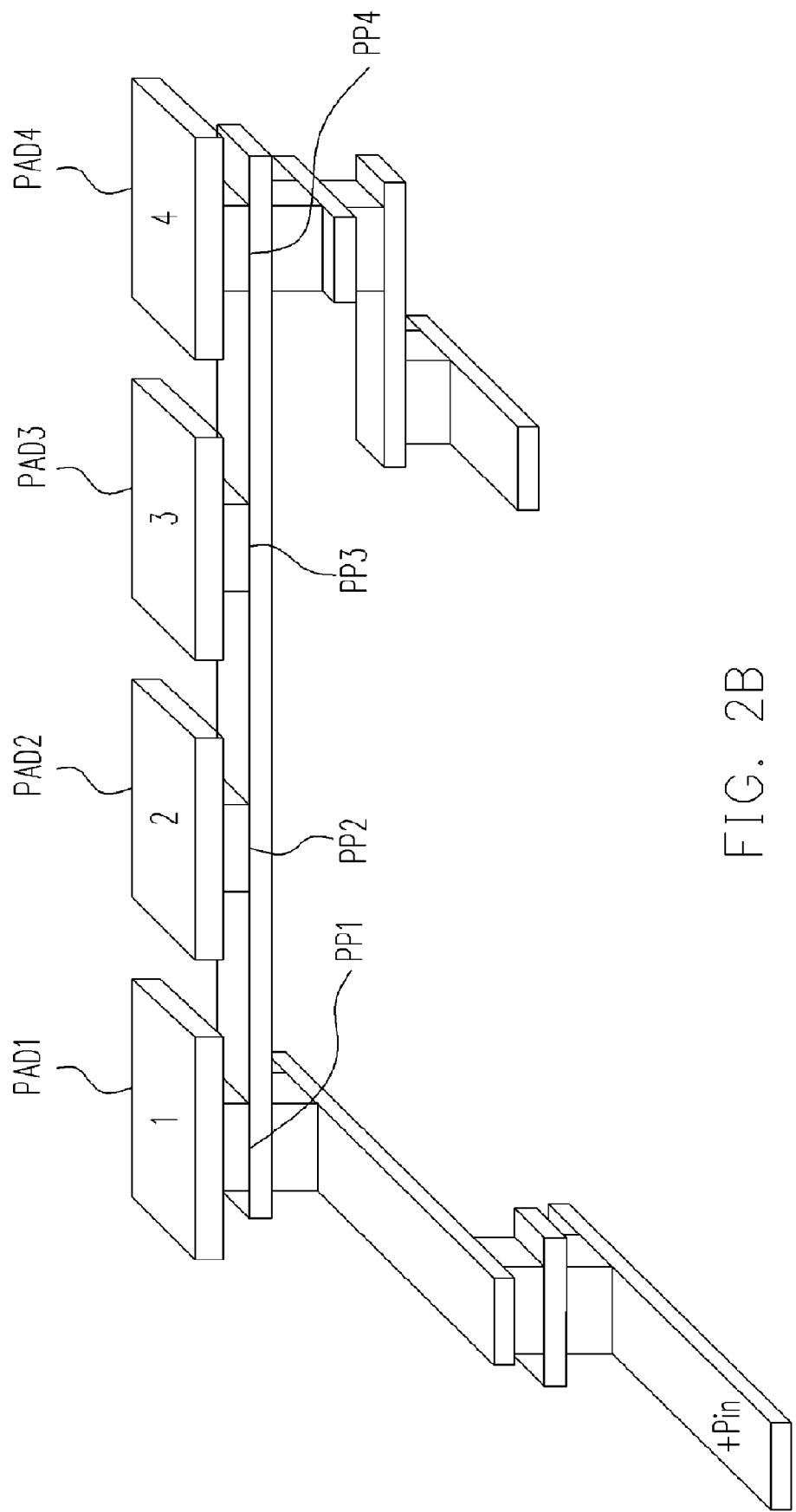
FIG. 2B schematically shows a 3D diagram illustrating another priority of selecting the probing points in the net inside the IC according to an embodiment of the present invention.

However, since there may be more than one candidate probing points in the same layer, step S152 is performed after step S151 (referring to FIG. 1). In step S152, a third candidate probing point, which is located closest to the interesting pin among the third candidate probing points in the net connecting to the selected interesting pin, is selected as the final probing point. For a clear description of step S152, FIG. 2B is referred. FIG. 2B schematically shows a 3D diagram illustrating another priority of selecting the probing points in the net inside the IC according to an embodiment of the present invention. As shown in FIG. 2B, there are 4 third candidate probing points PP1~PP4 in the net connecting to a specific interesting pin. Similar to FIG. 2A, only one probing pad among the probing pads PAD1~PAD4 shown in FIG. 2B is required to be selected and reserved, and others can be spared.

As shown in FIG. 2B, the third candidate probing points PP1~PP4 are all in the higher metal layer of the net (not necessarily the top metal layer of the IC). Therefore, the candidate probing point PP1, which is located closest to the interesting pin Pin, is selected as the final candidate probing point of the net in step S152.

After step S152 is completed, if there is any interesting pin whose final probing point is not determined yet (step S153), a next interesting pin is selected (step S154), and steps S151~S153 are repeated until all of the net connecting to the interesting pins had ensured the locations of their final probing points.

With the embodiment mentioned above, the probing pad comprising the metal layer and the via is automatically placed on the appropriate location of the net where further debugging may be required during the IC physical implementation. In addition, the user can select multiple nets for placing the probing pads on its appropriate location simultaneously. Furthermore, since the probing pads are pre-placed during the IC physical implementation, it is easy to ascertain that the IC, where the probing pad had been placed on, complies with the requirement of the layout rule. If the net needs to be probed after the IC has been made, the signal status of the net can be probed with e-beam probing technique by cutting out the passivation layer corresponding to the probing pad.

Although the invention has been described with reference to a particular embodiment thereof, it will be apparent to one of the ordinary skill in the art that modifications to the described embodiment may be made without departing from the spirit of the invention. Accordingly, the scope of the invention will be defined by the attached claims not by the above detailed description.

What is claimed is:

1. A method for placing probing pads suitable for placing at least one probing pad in an integrated circuit (IC), wherein, the probing pad is used to electrically conduct a probing point to a top metal layer, the IC comprising at least one interesting pin, and the method comprises:
   a. building a cross-reference database between a netlist and a layout;
   b. determining grid spacing based on the layout characteristic and generating a plurality of grids with fixed grid spacing;
   c. defining the plurality of grids located on a net connected to the interesting pin as first candidate probing points based on the cross-reference database;
   d. selecting one first candidate probing point among the first candidate probing points on each net where the probing pad can be placed on based on the metal layer where the first candidate probing points are located and the corresponding locations between the first candidate probing points and the interesting pin; and
   e. placing the probing pad on the probing point of each net, wherein the step d further comprises:
   f. excluding all of the first candidate probing points where the probing pad cannot be placed on, wherein the non-excluded first candidate probing points are defined as the second candidate probing points.

2. The method of claim 1, further comprising a step of specifying the interesting pin in the IC.

3. The method of claim 1, wherein the step a comprises:
   providing the layout and the netlist; and
   building the cross-reference database based on a correlation between the layout and the netlist.

4. The method of claim 1, wherein the step d further comprises:
   g. determining which one of the second candidate probing points is the probing point of a net connected to the interesting pin based on the metal layer where the second candidate probing points are located and the corresponding locations of the second candidate probing points and the interesting pin.

5. The method of claim 1, wherein the step f comprises:
   defining a blockage area corresponding to each metal layer based on the layout of each metal layer and a spacing rule of the design rule;
   selecting one metal layer starting from a first metal layer to a top metal layer sequentially; and
   defining the first candidate probing points, which are located in the selected metal layer pattern and outside the blockage area, as the second candidate probing points.

6. The method of claim 4, wherein the step g comprises:
   selecting the interesting pin sequentially;
   selecting and defining the second candidate probing points, which are located in the higher metal layer among the net connecting to the selected interesting pin, as the third candidate probing points; and
   selecting one of the third candidate probing points, which is closest to the interesting pin inside the net connecting to the selected interesting pin, as the probing point.

7. The method of claim 1, further comprising:
   performing a design rule check (DRC) on the IC where the probing pad had been placed on; and
   performing a layout vs. schematic (LVS) on the IC where the probing pad had been placed on.

8. A computer readable recording medium for storing a program executable in a computer system, wherein the program is used to place a probing pad into an integrated circuit (IC), the probing pad is used to electrically conduct a probing point to a top metal layer, the IC comprising at least one interesting pin, and the program comprises the following instructions:
   a. reading a cross-reference database between a netlist and a layout;
   b. determining grid spacing based on the layout characteristic and generating a plurality of grids with fixed grid spacing;
   c. defining the plurality of grids located on a net connected to the interesting pin as first candidate probing points based on the cross-reference database;
   d. selecting one first candidate probing point among the first candidate probing points on each net where the probing pad can be placed on based on the metal layer where the first candidate probing points are located and the corresponding locations between the first candidate probing points and the interesting pin; and e. placing the probing pad on the probing point of each net, wherein the instruction d further comprises;

f. excluding all of the first candidate probing points in each metal layer where the probing pad cannot be placed on, wherein the non-excluded first candidate probing points are defined as the second candidate probing points.

9. The computer readable recording medium of claim 8, wherein the program further comprises an instruction of specifying the interesting pin in the IC.

10. The computer readable recording medium of claim 8, wherein the instruction a of the program comprises:

reading the layout and the netlist; and building the cross-reference database based on a correlation between the layout and the netlist.

11. The computer readable recording medium of claim 8, wherein the instruction d of the program further comprises:

g. determining which one of the second candidate probing points is the probing point of a net connected to the interesting pin based on the metal layer where the second candidate probing points are located and the corresponding locations of the second candidate probing points and the interesting pin.

12. The computer readable recording medium of claim 8, wherein the instruction f of the program comprises:

defining a blockage area corresponding to each metal layer based on the layout of each metal layer and a spacing rule of the design rule;

selecting one metal layer starting from a first metal layer to a top metal layer sequentially; and defining the first candidate probing points, which are located in the selected metal layer pattern and outside the blockage area, as the second candidate probing points.

13. The computer readable recording medium of claim 11, wherein the instruction g of the program comprises:

selecting the interesting pin sequentially;

selecting and defining the second candidate probing points, which are located in the higher metal layer among the net connecting to the selected interesting pin, as the third candidate probing points; and selecting one of the third candidate probing points, which is closest to the interesting pin inside the net connecting to the selected interesting pin, as the probing point.

14. The computer readable recording medium of claim 8, wherein the program further comprises the following instructions:

performing a design rule check (DRC) on the IC where the probing pad had been placed on; and performing a layout vs. schematic (LVS) on the IC where the probing pad had been placed on.

* * * * *